United States Patent [19]

Bozio

[11] Patent Number: 4,560,953
[45] Date of Patent: Dec. 24, 1985

[54] FAIL-SAFE SQUARE-WAVE OSCILLATOR

[75] Inventor: Robert P. Bozio, Penn Hills, Pa.

[73] Assignee: American Standard Inc., Swissvale, Pa.

[21] Appl. No.: 642,453

[22] Filed: Aug. 20, 1984

[51] Int. Cl.[4] .............................................. H03B 5/08
[52] U.S. Cl. ................................. 331/108 D; 331/167
[58] Field of Search ............... 331/108 D, 117 R, 167, 331/116 R, 116 FE, 117 FE, 158

[56] References Cited

U.S. PATENT DOCUMENTS 4,310,807  1/1982  McKee ....................... 331/117 R X
4,509,023  4/1985  Heimlicher ..................... 331/167 X

OTHER PUBLICATIONS

English, "One Video Amplifier: Three Oscillators", The Electronic Engineer, Nov. 1969, p. 83.

Primary Examiner—Siegfried H. Grimm
Attorney, Agent, or Firm—J. B. Sotak

[57] ABSTRACT

A vital integrated circuit square-wave oscillator having an integrated circuit operational amplifier. A reference voltage dividing resistor network connected to an inverting input of the amplifier for providing a 50—50 duty cycle. An L-C tank circuit connected between the inverting input and a noninverting input for determining the frequency of oscillation. A starting capacitor for initiating the oscillating action and a regenerative feedback circuit for sustaining the oscillations.

10 Claims, 1 Drawing Figure

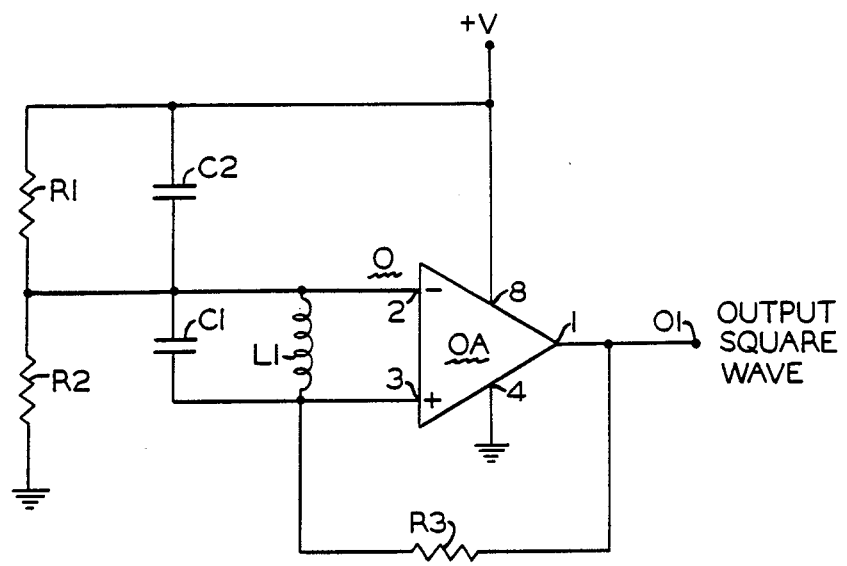

FAIL-SAFE SQUARE-WAVE OSCILLATOR

FIELD OF THE INVENTION

This invention relates to a vital square-wave oscillator and, more particularly, to a fail safe oscillating circuit employing an operational amplifier having a frequency of oscillation which is determined by a parallel capacitance-inductance network to produce a square-wave signal having a 50—50 duty cycle.

BACKGROUND OF THE INVENTION

In certain installations, such as in audio frequency (AF) track circuit equipment for railroad and mass and/or rapid transit operations, it is mandatory to ensure the safety and security of the crewmen and/or passengers as well as to protect the system and apparatus against damage and/or destruction by a false or unsafe condition. Thus, it is essential to exercise extreme care in designing the circuitry and selecting the components of the electronic track circuit equipment to ensure fail-safe operation. In the past, it had been found that the code rate representing the speed commands could be inadvertently increased when frequency of the output signals of the nonvital oscillating circuit decreased due to a component or circuit failure. For example, during documentation of the fail-safe testing, the speed command code rate of the code rate generator was unsafely increased from 180 Hz to 270 Hz when the output frequency of the previously designed voltage supply oscillator decreased from 6K Hz to 875 Hz.

OBJECTS OF THE INVENTION

Accordingly, it is an object of this invention to provide a new and improved vital oscillating circuit.

Another object of this invention is to provide a unique electronic oscillator which operates in a fail-safe manner.

A further object of this invention is to provide a fail-safe oscillating circuit including an operational amplifier having a resonant circuit coupled to the inverting and noninverting input terminals and having a feedback path coupled between the output terminal and the inverting input terminal.

Still another object of this invention is to provide a novel integrated circuit oscillator having a frequency determining tank circuit and having a feedback circuit for sustaining oscillation and having a voltage dividing network for providing a 50—50 duty cycle of the output signals.

Still a further object of this invention is to provide a vital oscillating circuit comprising, an operational amplifier having an inverting and a noninverting input terminal and an output terminal, a voltage dividing network for providing a reference voltage at one-half the voltage of a voltage supply source to the inverting input terminal, a resonant circuit for determining the frequency of oscillations coupled between the inverting and noninverting input terminals, a starting capacitor for providing a pulse of current when the voltage supply source is initially applied to start oscillation, and a feedback circuit coupled between the output terminal and the noninverting input terminal for sustaining oscillation.

SUMMARY OF THE INVENTION

Briefly, in accordance with the invention, there is provided a fail-safe electronic square-wave oscillator in which the frequency of oscillation will not decrease appreciably during a critical component or circuit failure. The oscillator includes an integrated circuit operational amplifier having an inverting and noninverting input terminal and an output terminal. A voltage divider having a pair of series-connected resistors connected between a positive voltage supply source and ground. The junction point between the series connected resistors is connected to the inverting input terminal to provide a reference voltage which is at one-half the voltage of the positive voltage supply source. A parallel L-C resonant circuit is connected between the inverting and noninverting input terminals for determining the frequency of oscillation and for providing a 50—50 duty cycle. A starting capacitor is connected between the positive voltage supply source and the inverting input terminal to provide a pulse of current when the positive voltage supply source is initially applied to initiate the oscillating action. A regeneration feedback circuit including a current-limiting resistor is connected between the output terminal and the noninverting input terminal for sustaining the oscillations.

BRIEF DESCRIPTION OF THE DRAWING

The foregoing objects and other attendant features and advantages will be more readily apparent and appreciated as the subject invention becomes more clearly understood by reference to the following detailed description when considered in conjunction with the accompanying drawing, wherein:

The single FIGURE in the drawing is a schematic circuit diagram of a vital or fail-safe integrated circuit operational amplifier oscillating circuit in accordance with the present invention.

DETAILED DESCRIPTION OF THE INVENTION

Referring now to the single FIGURE of the drawing, there is shown a fail-safe or vital electronic square-wave oscillating circuit which is generally represented by character O. The oscillator O includes a voltage dividing network made up of series-connected first and second resistors R1 and R2 which have equal resistance values. As shown, the upper end of resistor R1 is connected to a suitable source of d.c. power supply voltage +V while the lower end of resistor R1 is connected to the upper end of resistor R2. The lower end of resistor R2 is connected to a voltage reference level or ground. The common or junction point of resistors R1 and R2 is connected to the common or junction point of capacitors C1 and C2 which, in turn, is connected to the negative or inverting input terminal or pin 2 of an integrated circuit operational amplifier OA. The operational amplifier may be of the type manufactured and sold by Texas Instruments Inc., Dallas, Tex., and designated as a TL082MJG. Thus, the voltage dividing resistors R1 and R2 provide a reference voltage at one-half ($\frac{1}{2}$) the power supply voltage to the inverting input pin 2. The lower end of capacitor C1 is connected to the positive or noninverting input terminal or pin 3 of the operational amplifier OA while the upper end of capacitor C2 is connected to the positive voltage terminal +V. It will be appreciated that the capacitor C1, along with a parallel connected inductor L1 form a tuned resonant or tank circuit which determines the frequency of oscillation of the oscillating circuit 0. The inductor L1 has a quality factor Q of at least 5 in order to provide a sufficient voltage swing at the differential input terminals. The voltage dividing resistors R1 and R2 cause the voltage across the L1-C1 network to be centered between the supply rails which ensures that the square-wave output signal will have a 50—50 duty cycle. The resistor R1 also supplies a small current to overcome losses in the L1-C1 network to sustain oscillation. The frequency of oscillation is determined by the following equation:

$$f = \frac{1}{2\pi \sqrt{(L1)(C1)}}$$

The stability of the output frequency versus temperature is dependent upon the stability of capacitor C1 and inductor L1 over the same temperature range.

It will be seen that positive or regenerative feedback is provided for the op-amp OA via a current-limiting resistor R3 which is interconnected between the output terminal and noninverting input terminal or pin 3. It will be noted that an appropriate d.c. voltage terminal 8 of the operational amplifier OA is directly connected to the positive supply terminal +V, and that another d.c. voltage terminal 4 is connected to the voltage reference level or ground. The square-wave oscillating signals developed on output terminal 1 are fed to voltage terminal O1 which is connected to subsequent circuitry which forms part of the AF track circuit equipment. In practice, output signals should have a frequency of 6K Hz and the voltage swing is limited by the OP-AMP circuitry which is typically around 2 volts less than the power supply voltage. Further, to ensure high selectivity, the inductor L1 of the parallel resonant circuit must have a high quality factor Q and the operational amplifier must exhibit a high internal resistance.

In describing the operation of the vital electronic square-wave oscillating circuit, it will be assumed that the elements or components are intact and functioning properly and that the d.c. power supply and load are appropriately connected to the circuit. Under this condition, the oscillator O is powered by the d.c. operating voltage +V and an initial pulse of current is provided by the capacitor C2 to start the oscillating of the vital circuit 0. Thus, square-wave output signals having a frequency of 6K Hz will be developed on the output terminal O1. As noted above, it is essential that under no circumstance should the frequency of the output signals decrease appreciably due to a critical component or circuit failure. That is, an open-circuited or short-circuited condition must not result in a substantial reduction of the frequency since an erroneous less restrictive condition could be unsafely emulated to jeopardize the operation of the system. As previously noted, it has been found that a frequency reduction in the output signal of the voltage supply oscillator can result in an increase of the code rate developed by a code rate generator. During the vital testing period, it is necessary to analyze and evaluate every possible failure mode of each component of the square-wave oscillating circuit O. The opening of resistor R1 or R2 has little, if any, effect on the operation of the oscillator; however, if power is removed and then reapplied, the oscillator will not restart when the resistor R1 is opened. The opening of resistor R3 causes a slight increase of the frequency to 6048 Hz. The opening of capacitor C1 safely increases the frequency of oscillation to 89,010 Hz. If the inductor L1 becomes opened, the oscillator stops. The opening of the starting capacitor C2 has no effect on the frequency of oscillation, and the oscillator may or may not start upon removal and reapplication of power. If either the tuning capacitor C1 or tuning inductor L1 is short-circuited, the oscillator stops oscillating. The short-circuiting of any of the resistors or capacitor C2 is a safe failure. The opening or shorting of the input pins 2 and 3 of the operational amplifier OA causes cessation of the oscillations. Thus, the vital oscillating circuit O operates in a fail-safe manner in that no foreseeable critical component failure or circuit malfunction is capable of causing an unsafe condition.

Thus, the present circuit has been described in such full, clear, precise, and exact terms as to enable any skilled artisan to which the invention relates to make and use the same. It will be appreciated that the details of the invention which have been disclosed and described in the accompanying drawing and foregoing description are considered as illustrative and not restrictive in nature. Accordingly, it is understood that various alterations may be made by persons skilled in the art without departing from the spirit and scope of this invention. Thus, it is apparent that certain modifications and changes can be made to the presently described invention, and therefore it is understood that alterations, equivalents and substitutions producing the same results in substantially the same manner with substantially the same features are herein meant to be included by the appended claims.

Having thus described the invention, what I claim as new and desire to secure by Letters Patent, is:

1. A vital oscillating circuit comprising, an operational amplifier having an inverting and a noninverting input terminal and an output terminal, a voltage dividing network for providing a reference voltage at one-half the voltage of a voltage supply source to said inverting input terminal, a resonant circuit for determining the frequency of oscillation coupled between said inverting and noninverting input terminals, a starting capacitor for providing a pulse of current when the voltage source is initially applied to start oscillation, and a feedback circuit coupled between said output terminal and said noninverting input terminal for sustaining oscillation.

2. The vital oscillating circuit, as defined in claim 1, wherein said voltage dividing network includes a pair of equal-valued resistors.

3. The vital oscillating circuit, as defined in claim 1, wherein said resonant circuit takes the form of an L-C tank circuit.

4. The vital oscillating circuit, as defined in claim 1, wherein said feedback circuit includes a current-limiting resistor.

5. The vital oscillating circuit, as defined in claim 1, wherein said starting capacitor is coupled between the voltage supply source and said inverting input terminal.

6. The vital oscillating circuit, as defined in claim 1, wherein said voltage dividing network includes a first and a second resistor, each of which has an equivalent resistance value.

7. The vital oscillating circuit, as defined in claim 1, wherein said voltage dividing network is centered about said voltage supply source so that said oscillations have a 50—50 duty cycle.

8. The vital oscillating circuit, as defined in claim 1, wherein said oscillation developed on said output terminal takes the form of square-wave signals.

9. The vital oscillating circuit, as defined in claim 1, wherein said voltage dividing network includes a pair of equivalent series-connected resistors.

10. A fail-safe electronic square-wave oscillator in which the frequency of oscillation is unable to decrease appreciably during a component or circuit failure comprising, an integrated circuit operational amplifier having an inverting and noninverting input terminal and an output terminal, a voltage divider having a pair of series-connected resistors connected between a positive voltage supply source and ground, the junction point of said series-connected resistors connected to said inverting input terminal to provide a reference voltage which is at one-half the voltage of the positive voltage supply source, a parallel L-C resonant circuit connected between said inverting and non-inverting input terminal for determining the frequency of oscillation and for providing a 50—50 duty cycle, a starting capacitor connected between the positive voltage supply source and said inverting input terminal to provide a pulse of current when the positive voltage supply source is initially applied to initiate the oscillating action, and a regenerative feedback circuit having a current-limiting resistor connected between said output terminal and said noninverting input terminal for sustaining the oscillations.

* * * * *